(12) United States Patent
Oh et al.

(10) Patent No.: US 12,108,650 B2
(45) Date of Patent: Oct. 1, 2024

(54) DISPLAY DEVICE INCLUDING STEPPED SECTION SUBSTRATE WITH EMBEDDED CAMERA

(71) Applicant: LG Display Co., Ltd., Seoul (KR)

(72) Inventors: Jae-Young Oh, Goyang-si (KR); Sung-Ki Kim, Goyang-si (KR); Bok-Young Lee, Seoul (KR); Young-Wook Lee, Goyang-si (KR); Chang-Hyun Song, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/117,310

(22) Filed: Mar. 3, 2023

(65) Prior Publication Data

US 2023/0209969 A1    Jun. 29, 2023

Related U.S. Application Data

(63) Continuation of application No. 17/124,080, filed on Dec. 16, 2020, now Pat. No. 11,626,456.

(30) Foreign Application Priority Data

Dec. 18, 2019 (KR) .................. 10-2019-0169879

(51) Int. Cl.
*H10K 59/65* (2023.01)
*H10K 50/84* (2023.01)
(Continued)

(52) U.S. Cl.
CPC ........... *H10K 59/65* (2023.02); *H10K 50/844* (2023.02); *H10K 50/86* (2023.02); *H10K 59/122* (2023.02);
(Continued)

(58) Field of Classification Search
CPC ...... H10K 50/844; H10K 50/86; H10K 50/15; H10K 50/16; H10K 50/17; H10K 50/171;
(Continued)

(56) References Cited

U.S. PATENT DOCUMENTS

| 10,895,773 B1 | 1/2021 | Zhang |
| 2012/0206669 A1 | 8/2012 | Kim et al. |

(Continued)

FOREIGN PATENT DOCUMENTS

| CN | 107946341 A | * | 4/2018 | ......... H01L 27/3227 |
| CN | 109411519 A | * | 3/2019 | ......... H01L 27/3232 |

(Continued)

*Primary Examiner* — Ida M Soward
(74) *Attorney, Agent, or Firm* — Birch, Stewart, Kolasch & Birch, LLP

(57) ABSTRACT

Discussed is a display device including a substrate including a first region and a second region surrounding the first region, a plurality of first subpixels on the first region of the substrate, and a plurality of second subpixels on the second region of the substrate. The first region includes a transmission portion adjacent to the plurality of first subpixels. Each of the first and second subpixels includes a first electrode, a first common layer, an organic emission layer, a second common layer, and a second electrode stacked in order. The first and second common layers are located in succession in the first and second subpixels.

21 Claims, 17 Drawing Sheets

(51) Int. Cl.
*H10K 50/844* (2023.01)
*H10K 50/86* (2023.01)
*H10K 59/12* (2023.01)
*H10K 59/122* (2023.01)
*H10K 59/131* (2023.01)
*H10K 59/40* (2023.01)
*H01L 27/146* (2006.01)
*H10K 50/15* (2023.01)
*H10K 50/16* (2023.01)
*H10K 50/17* (2023.01)
*H10K 50/818* (2023.01)
*H10K 50/828* (2023.01)
*H10K 59/121* (2023.01)
*H10K 59/35* (2023.01)
*H10K 102/00* (2023.01)

(52) U.S. Cl.
CPC ........... *H10K 59/131* (2023.02); *H10K 59/40* (2023.02); *G09G 2300/0408* (2013.01); *G09G 2300/0804* (2013.01); *H01L 27/14678* (2013.01); *H10K 50/15* (2023.02); *H10K 50/16* (2023.02); *H10K 50/17* (2023.02); *H10K 50/171* (2023.02); *H10K 50/818* (2023.02); *H10K 50/828* (2023.02); *H10K 59/1216* (2023.02); *H10K 59/35* (2023.02); *H10K 59/353* (2023.02); *H10K 2102/00* (2023.02); *H10K 2102/351* (2023.02)

(58) Field of Classification Search
CPC .... H10K 50/818; H10K 50/828; H10K 50/80; H10K 50/868; H10K 59/65; H10K 59/122; H10K 59/131; H10K 59/40; H10K 59/1216; H10K 59/35; H10K 59/353; H10K 59/121; H10K 59/12; H10K 59/00; H10K 77/10; H10K 77/111; H10K 2102/00; H10K 2102/351; H01L 27/14678; H04N 23/57; G09G 3/041; G09G 2300/0408; G09G 2300/0804
See application file for complete search history.

(56) References Cited

U.S. PATENT DOCUMENTS

| | | | |
|---|---|---|---|
| 2013/0258234 A1 | 10/2013 | Park et al. | |
| 2015/0200236 A1* | 7/2015 | Kim | H10K 59/121 438/35 |
| 2017/0148861 A1* | 5/2017 | Kim | H10K 59/1216 |
| 2018/0089485 A1* | 3/2018 | Bok | G06F 3/0445 |
| 2018/0301658 A1* | 10/2018 | Chung | H10K 71/00 |
| 2018/0315357 A1* | 11/2018 | Nam | H10K 50/868 |
| 2019/0212788 A1* | 7/2019 | Kwak | G06F 3/041 |
| 2019/0243427 A1 | 8/2019 | Nakamura et al. | |
| 2019/0260919 A1 | 8/2019 | Kwak et al. | |
| 2019/0278132 A1* | 9/2019 | Nakamura | G02B 5/3025 |
| 2019/0310501 A1 | 10/2019 | Nagata et al. | |
| 2019/0310724 A1 | 10/2019 | Yeke Yazdandoost et al. | |
| 2019/0384121 A1* | 12/2019 | Nishiwaki | G02F 1/133528 |
| 2020/0144344 A1* | 5/2020 | Wang | H10K 71/00 |
| 2020/0176520 A1 | 6/2020 | Kim et al. | |
| 2020/0186688 A1* | 6/2020 | Chen | H04N 23/54 |
| 2020/0201105 A1 | 6/2020 | Cheng | |
| 2020/0357863 A1* | 11/2020 | Nakamura | G09F 9/30 |
| 2021/0005849 A1 | 1/2021 | Zhou et al. | |
| 2021/0036071 A1 | 2/2021 | Zhang | |
| 2021/0356788 A1 | 11/2021 | Zha | |
| 2021/0359051 A1* | 11/2021 | Jin | H10K 59/40 |
| 2021/0369051 A1 | 11/2021 | Jin | |

FOREIGN PATENT DOCUMENTS

| | | | | |
|---|---|---|---|---|
| CN | 109994047 A | * | 7/2019 | ............ G09F 9/30 |
| CN | 110190097 A | | 8/2019 | |
| CN | 110350104 A | | 10/2019 | |
| CN | 110426878 A | * | 11/2019 | ....... G02F 1/133512 |
| KR | 10-2018-0056473 A | | 5/2019 | |
| KR | 102031648 B1 | * | 10/2019 | ............ H04N 23/75 |

* cited by examiner

DISPLAY DEVICE INCLUDING STEPPED SECTION SUBSTRATE WITH EMBEDDED CAMERA

CROSS-REFERENCE TO RELATED APPLICATIONS

This application is a Continuation Application of U.S. patent application Ser. No. 17/124,080 filed on Dec. 16, 2020, which claims the priority benefit of Korean Patent Application No. 10-2019-0169879, filed on Dec. 18, 2019 in the Republic of Korea, where the entire contents of all these applications are hereby expressly incorporated by reference into the present application.

BACKGROUND OF THE INVENTION

Field of the Invention

The present invention relates to a display device, and more particularly, to a display device capable of securing transmittance in a structure in which a camera is provided beneath a panel.

Discussion of the Related Art

As the information age has fully arrived in recent years, the field of displays that visually display electrical signals containing information has rapidly developed. Accordingly, various flat display devices having excellent features, such as thinness, light weight, and low power consumption, have been developed, and have rapidly replaced existing cathode ray tubes (CRTs).

Specific examples of such flat display devices can include a liquid crystal display (LCD) device, a plasma display panel (PDP) device, a field emission display (FED) device, an organic light-emitting display (OLED) device, and so on.

Among them, the organic light-emitting display device is considered a competitive application, because it does not require a separate light source and enables realization of compact device design and vivid color display.

Such an organic light-emitting display device is applied to various display devices such as televisions, smart phones, e-books, monitors, wearable electronic devices, navigation devices, notebooks, etc. In addition, the organic light-emitting display device is combined with a camera to enable checking and editing of an image captured by the camera as well as screen display.

Here, the display device is typically configured such that a camera and a display panel are formed in separate processes and the camera is then installed in the bezel outside the display panel. In this case, the width and thickness of the bezel outside the display panel have to be increased because the bezel protrudes or a large number of portions to be covered are present in a non-display region for the configuration of modules to drive the camera, which can cause the device to be thicker and lead to a decrease in user's visual sensation. Therefore, efforts are being made to solve this issue.

SUMMARY OF THE INVENTION

Accordingly, the present invention is directed to a display device that substantially obviates one or more problems due to limitations and disadvantages of the related art.

An object of the present invention is to provide a display device that has improved transmittance and relieves a visual difference in a camera region, even though a camera is provided in an active region, by changing the configuration of a substrate in a region corresponding to the camera.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, the present invention relates to a display device that has improved transmittance and an enhanced ability to recognize a camera in a structure in which the camera is provided beneath a substrate.

In accordance with an aspect of the present invention, there is provided a display device that includes a substrate divided into a camera region and a non-camera region while having a first surface and a second surface, a camera positioned beneath the first surface of the substrate so as to correspond to the camera region, a stepped section formed by removing a portion of a first thickness from the first surface of the substrate so as to correspond to the camera region, a first array unit including at least one subpixel on the second surface corresponding to the camera region of the substrate, a second array unit including a plurality of subpixels on the second surface corresponding to the non-camera region of the substrate, and an optical film configured to cover the first and second array units.

In accordance with another aspect of the present invention, there is provided a display device that includes a substrate divided into a camera region and a non-camera region while having a first surface and a second surface, a camera positioned beneath the first surface of the substrate so as to correspond to the camera region, a stepped section formed by removing a portion of a first thickness from the first surface of the substrate so as to correspond to the camera region, a first array unit including at least one subpixel on the second surface corresponding to the camera region of the substrate, a second array unit including a plurality of subpixels on the second surface corresponding to the non-camera region of the substrate, a touch sensor on the first and second array units, and an optical film configured to cover the touch sensor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
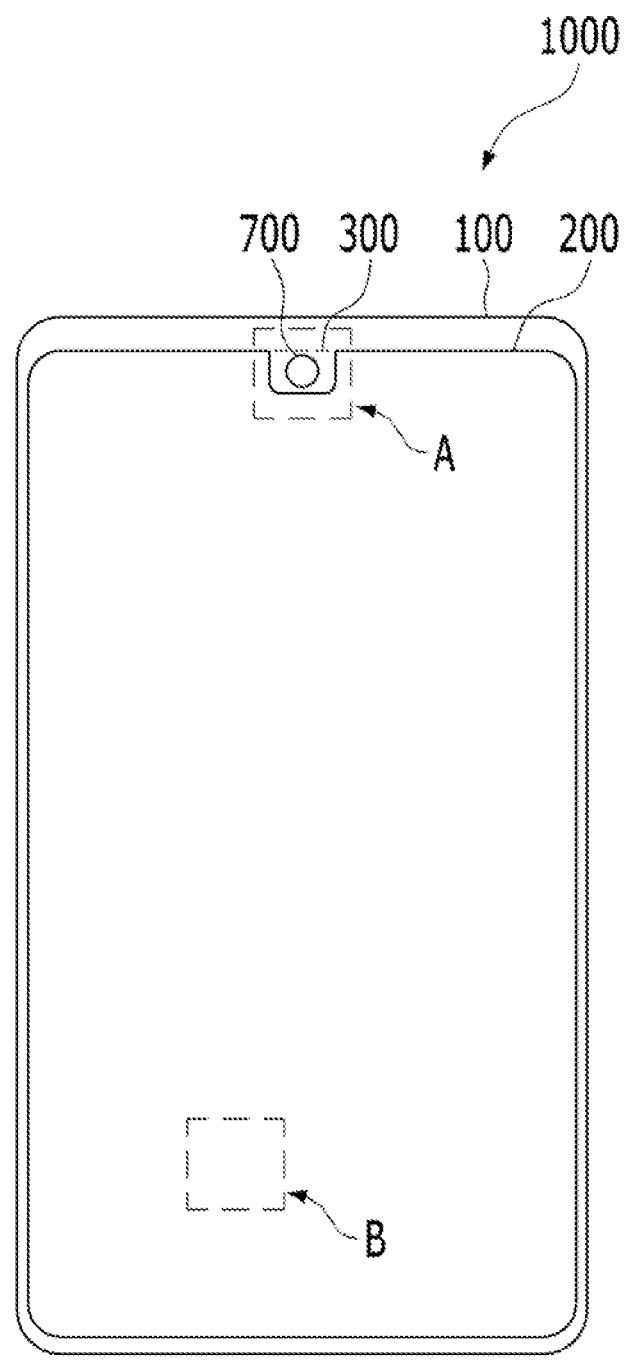
FIG. 1 is a top view illustrating a display device according to one or more embodiments of the present invention.

Reference will now be made in detail to the preferred embodiments of the present invention, examples of which are illustrated in the accompanying drawings. Wherever possible, the same reference numbers will be used throughout the drawings to refer to the same or like parts. In the following description, a detailed description of known functions and configurations incorporated herein will be omitted when the same can make the subject matter of the present invention rather unclear. The names of components used herein are selected in consideration of ease of preparation of the specification, and can be different from the names of parts of actual products.

In the drawings for explaining the various embodiments of the present invention, the illustrated shape, size, ratio, angle, and number are given merely by way of example, and thus do not limit the disclosure of the present invention. Throughout the specification, the same reference numerals designate the same constituent elements. In the following description, a detailed description of known functions and configurations incorporated herein will be omitted when the same can make the subject matter of the present invention rather unclear. The terms "comprises," "includes," and/or "has" used herein do not preclude the presence or addition of other elements unless used along with the term "only". The singular forms "a," "an," and "the" are intended to include the plural forms as well, unless the context clearly indicates otherwise.

The components involved in the various embodiments of the present invention should be interpreted as including an error range even if there is no explicit description thereof.

In the various embodiments of the present invention, when describing positional relationships, for example, when the positional relationship between two parts is described using "on", "above", "below", "beside", or the like, one or more other parts can be located between the two parts, unless the term "directly" or "closely" is used.

In the various embodiments of the present invention, when describing temporal relationships, for example, when the temporal relationship between two actions is described using "after", "subsequently", "next", "before", or the like, the actions may not occur in immediate succession, unless the term "directly" or "just" is used.

In the various embodiments of the present invention, although terms such as, for example, "first" and "second" can be used to describe various elements, these terms are merely used to distinguish the same or similar elements from each other and may not define order. Therefore, in the specification, an element modified by "first" can be the same as an element modified by "second" without exceeding the technical scope of the present invention unless otherwise mentioned.

The respective features of the various embodiments of the present invention can be partially or fully coupled to and combined with each other, and can be technically linked and driven in various manners. These embodiments can be performed independently of each other, or can be performed in association with each other.

Figure 2A:
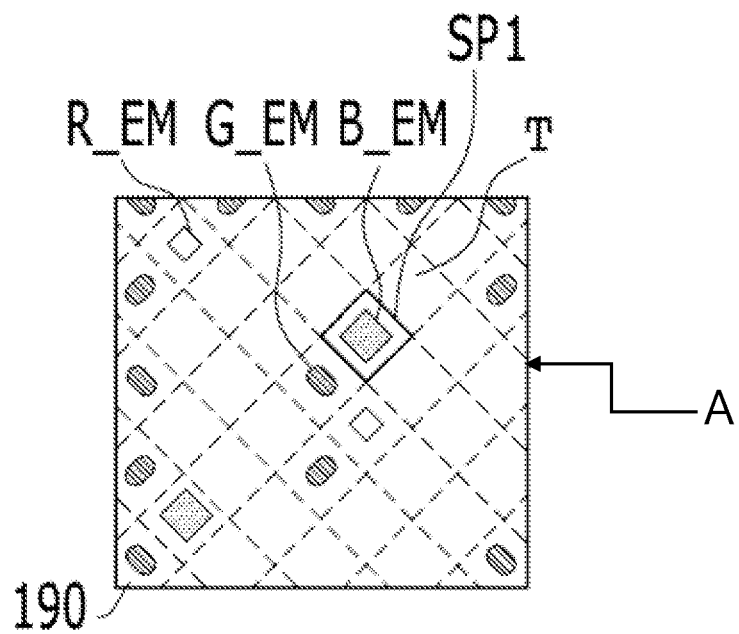
FIGS. 2A and 2B are enlarged top views illustrating regions A and B of FIG. 1, respectively, in a display device according to a first embodiment of the present invention.
Figure 2B:
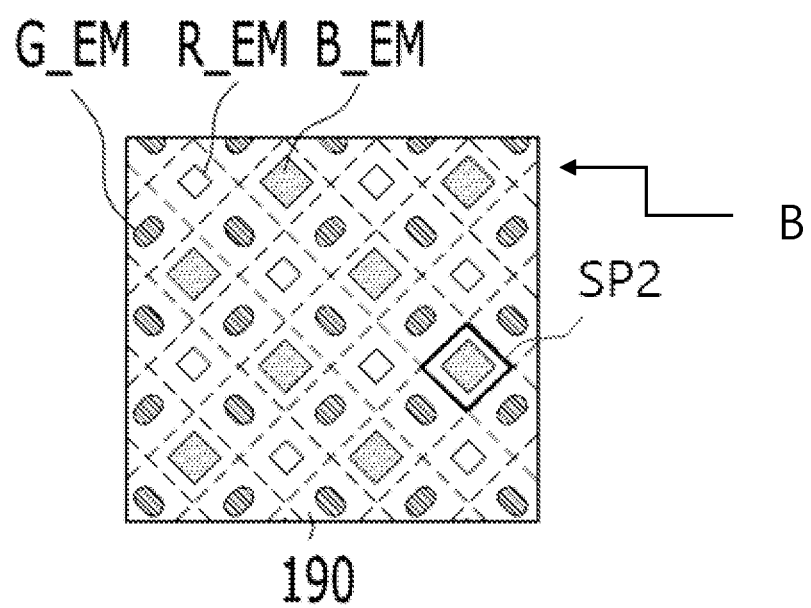

FIG. 1 is a top view illustrating an example of a display device according to one or more embodiments of the present invention. FIGS. 2A and 2B are enlarged top views illustrating regions A and B of FIG. 1, respectively, in a display device according to a first embodiment of the present invention. The display device according to all embodiments of the present invention are operatively coupled and configured.

As illustrated in FIGS. 1 to 2B, the display device, which is designated by reference numeral 1000, according to the first embodiment of the present invention can include a substrate 100 divided into (or includes) a camera region (see, e.g., region A corresponding to reference numeral 700 in FIG. 1) and a non-camera region (see, e.g., region B excluding reference numeral 700) while having a first surface (lower surface of reference numeral 100 in FIGS. 6 and 7) and a second surface (upper surface of reference numeral 100 in FIGS. 6 and 7), a camera 700 (see FIG. 6) positioned beneath the first surface of the substrate so as to correspond to the camera region, a stepped section 100a (see FIG. 6) formed by removing a portion of a first thickness from the first surface of the substrate so as to correspond to the camera region, a first array unit (region A) including at least one subpixel on the second surface corresponding to the camera region of the substrate, a second array unit (region B) including a plurality of subpixels on the second surface corresponding to the non-camera region of the substrate, and an optical film 300 covering the first and second array units. The location, shape, size and number of region A and the location, shape, size and number of region B as shown in FIG. 1 are mere examples and can vary. The embodiments of the present invention encompass fully all such variations.

The display device 1000 according to one or more embodiments of the present invention is configured such that the camera 700 is provided beneath an active region in which the subpixels on the substrate 100 are formed. In particular, the display device 1000 can increase an effective planar region, compared to the structure in which the camera 700 is provided outside the active region, and can result in a narrow bezel since the camera is not provided outside the active region, thereby reducing the size of the corresponding region.

Here, the active region refers to an overlapping region in the optical film 300, and includes a region in which a polarizing film 200 is formed, including the camera 700. The optical film 300 can function to protect the substrate 100 and components formed on the substrate 100 and can be a glass or a transparent optical film having certain rigidity.

The edge of the substrate 100, except for the active region, is referred to as an outer region. The outer region can be provided with a pad unit. The outer region can be provided with a pad electrode included in the pad unit, and a link wiring electrically extending from the active region to the pad electrode.

In addition, the display device 1000 according to one or more embodiments of the present invention is advantageous in that display is possible when the camera is turned off because subpixels are arranged even in the region where the camera 700 is located.

Meanwhile, the display device according to one or more embodiments of the present invention is characterized in that the substrate 100 and the configuration on the substrate are changed by providing an array unit, including a thin film transistor and a light-emitting device, above the camera in order to prevent the camera beneath the array unit from being discerned by the eye during emission of light from the upper region of the camera.

In particular, the display device 1000 according to one or more embodiments of the present invention can be configured such that subpixels with a first resolution are arranged corresponding to the non-camera region, as illustrated in FIG. 2B, and subpixels with a second resolution lower than the first resolution are arranged corresponding to the camera region, as illustrated in FIG. 2A.

As illustrated in the drawings, R_EM refers to a red emission portion, G_EM refers to a green emission portion, and B_EM refers to a blue emission portion. FIGS. 2A and 2B illustrate that a bank 190 that changes the open region of the emission portion is provided in each subpixel SP1 and SP2, respectively, so that the red, green, and blue emission portions R_EM, G_EM, and B_EM have different areas. In FIG. 2B, each subpixel SP2 is represented as a dotted region, and is formed by surrounding the emission portion R_EM or G_EM or B_EM with the bank 190.

In the illustrated example, when the display device is implemented as an organic light-emitting display device, the blue emission portion B_EM has a relatively larger area than the other color emission portions G_EM and R_EM in order to compensate for the difference in luminance efficiency of the blue organic emission layer from the other color organic emission layers due to material limitations pertaining to the blue organic emission layer. In addition, FIG. 2B illustrates that four emission portions, namely, the red emission portion R_EM, the green emission portion G_EM, the blue emission portion B_EM, and the green emission portion G_EM, arranged clockwise with respect to the non-camera region are repeatedly collected in a diamond form. Here, two green emission portions G_EM are disposed in one diamond-shaped set, by further adding the green emission portion G_EM, because the realization of white light in the display device is highly dependent on green light. In FIGS. 2A and 2B, the green emission portion G_EM is illustrated as having an approximately elliptical shape with a diagonal long axis. Specifically, the left and right green emission portions G_EM are formed to have opposite diagonal long axes in order to balance light emission without the difference in each region.

However, the shape of such an emission portion is given merely by way of example. If the material limitations pertaining to the blue emission portion are overcome, the blue emission portion B_EM and the other color emission portions G_EM and R_EM can have the same size or similar sizes. In addition, when there is a color that is dependent on the method of the application in which the display device is used, as well as only the green emission portion, the emission portion related to that color can be weighted for arrangement.

It should be noted in one or more embodiments of the present invention that the emission portions R_EM, G_EM, and B_EM in region A corresponding to the camera 700 have a lower density of arrangement than the emission portions R_EM, G_EM, and B_EM in region B corresponding to the non-camera region, as illustrated in FIG. 2A. Through this structure, the display device according to one or more embodiments of the present invention allows the extinction coefficients of the corresponding components in the camera to be decreased by relatively lowering the emission portions R_EM, G_EM, and B_EM or the density of arrangement thereof in the region corresponding to the camera 700, compared to those in the non-camera region. Thus, when the camera 700 is driven to recognize ambient light, the light is absorbed by the emission portions, the wiring, or the like, thereby preventing deterioration in visual recognition of the camera 700. In addition, in the configuration above the camera 700, the transmittance thereof is increased to improve the ability to recognize ambient light. In addition, since the camera 700 is also provided with some array configuration to distinguish the configuration of the camera 700 from other regions when the camera is turned off, it is possible to prevent the camera from being recognized by ambient light.

In the example illustrated in FIG. 2A, the region corresponding to the camera and having a low density of arrangement of the emission portions is provided with a transmission portion T having neither an emission layer nor a bank. Thus, ambient light does not pass through the organic emission layer when the light enters through the transmission portion T, and the transmission portion T also prevents the thick bank 190 from partially absorbing light.

The stepped section 100a on the substrate 100 of the present invention is formed by removing all or part of the thickness of the substrate 100 in adaption to the camera 700. The substrate 100 can be, for example, either a plastic substrate or a glass substrate. In some cases, the substrate 100 can be formed by depositing a plurality of layers. Advantageously, the substrate 100 is flexible when it has a predetermined thickness or less.

When the substrate 100 is formed by depositing a plurality of layers, for example, an interlayer inorganic insulating layer can be interposed between multiple polymer layers.

Hereinafter, a configuration of other emission portions will be described.

Figure 3:
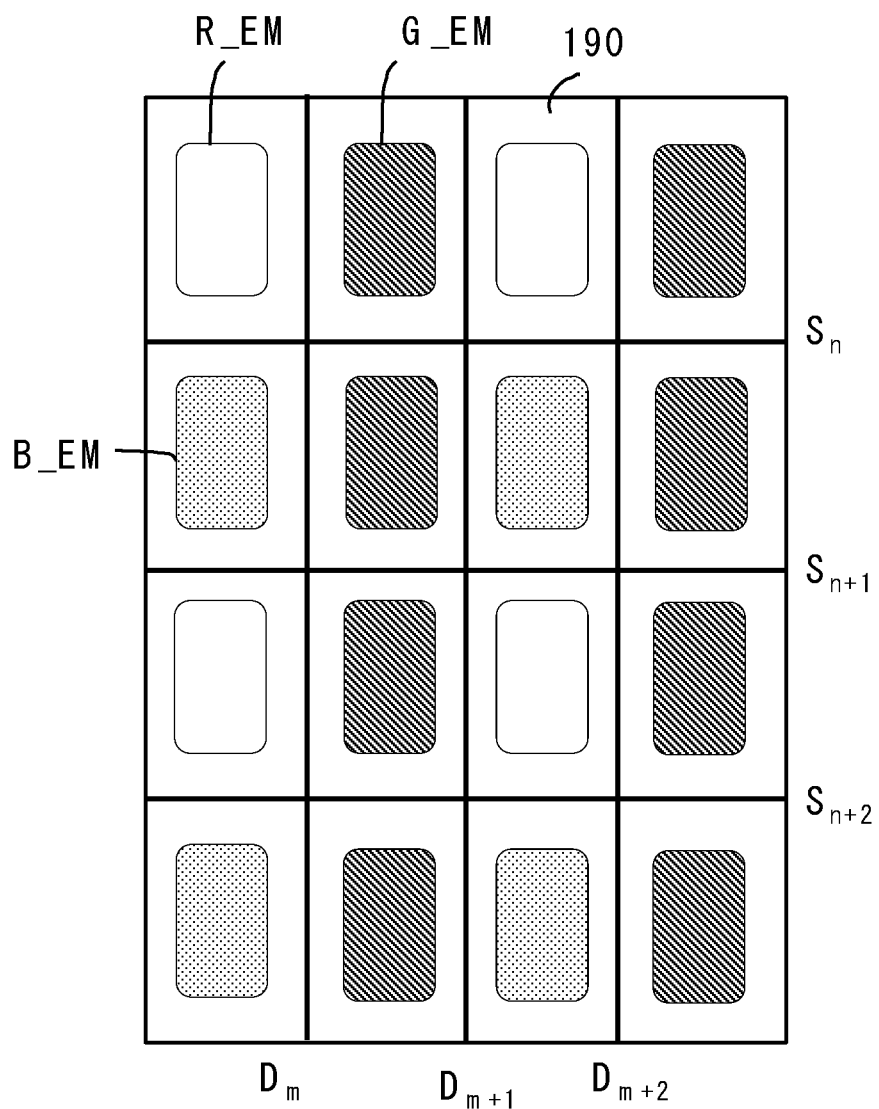
FIG. 3 is an enlarged top view illustrating region B of FIG. 1 in a display device according to a second embodiment of the present invention.
Figure 4A:
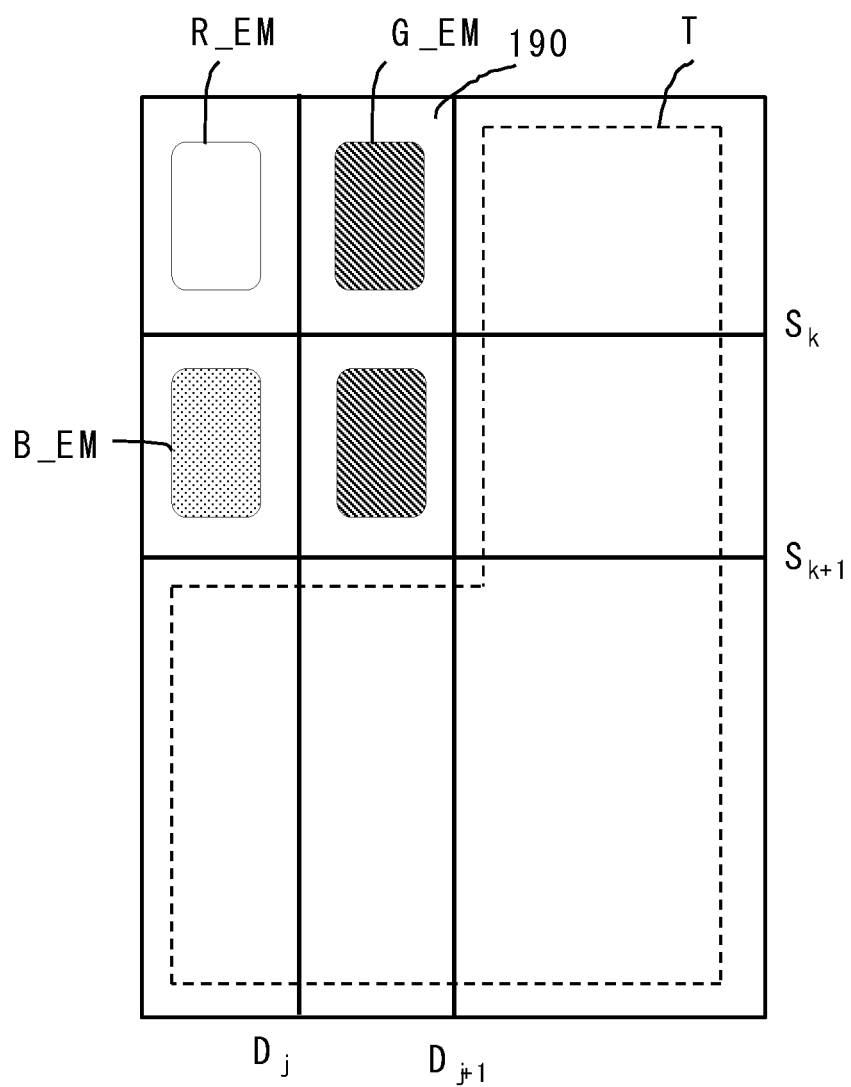
FIG. 4A is an enlarged top view illustrating region A of FIG. 1 in the display device according to the second embodiment of the present invention.
Figure 4B:
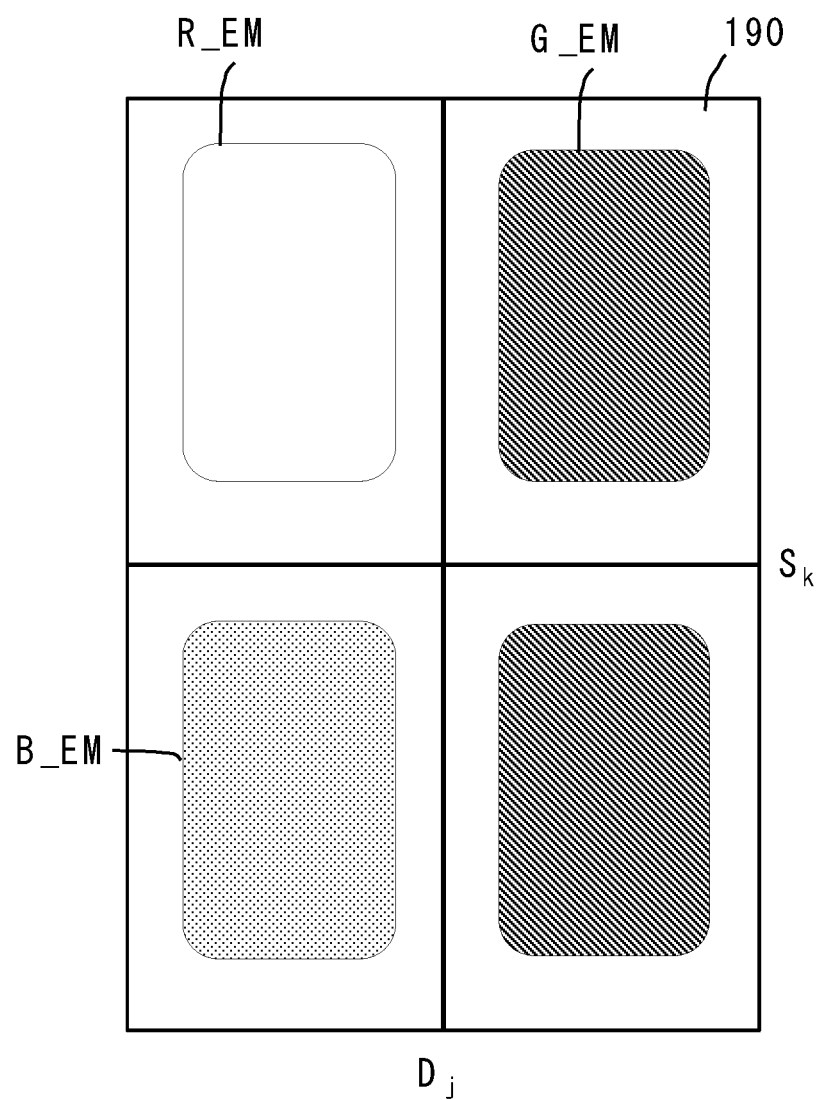
FIG. 4B is an enlarged top view illustrating region A of FIG. 1 in a display device according to a third embodiment of the present invention.
Figure 5:
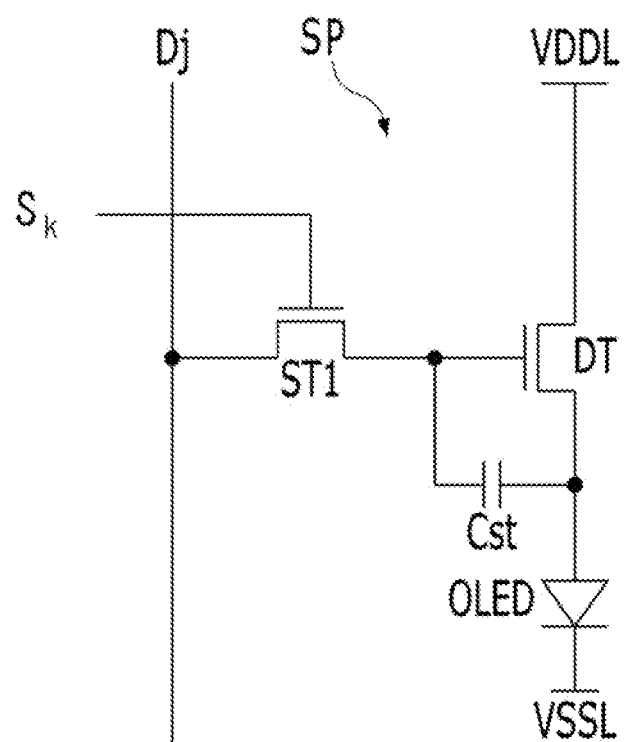
FIG. 5 is a circuit diagram of an example of each subpixel.
Figure 6:
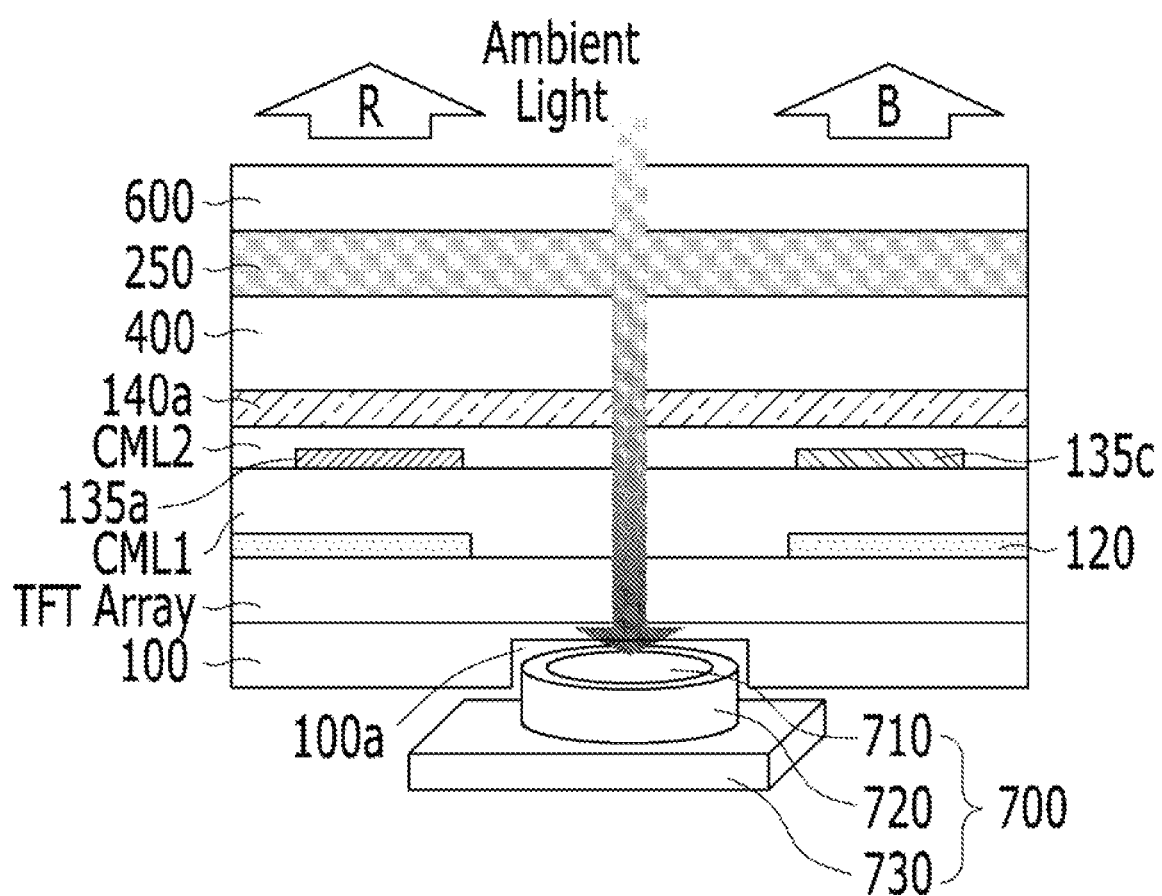
FIG. 6 is a cross-sectional view of region A according to an example of the second embodiment.
Figure 7:
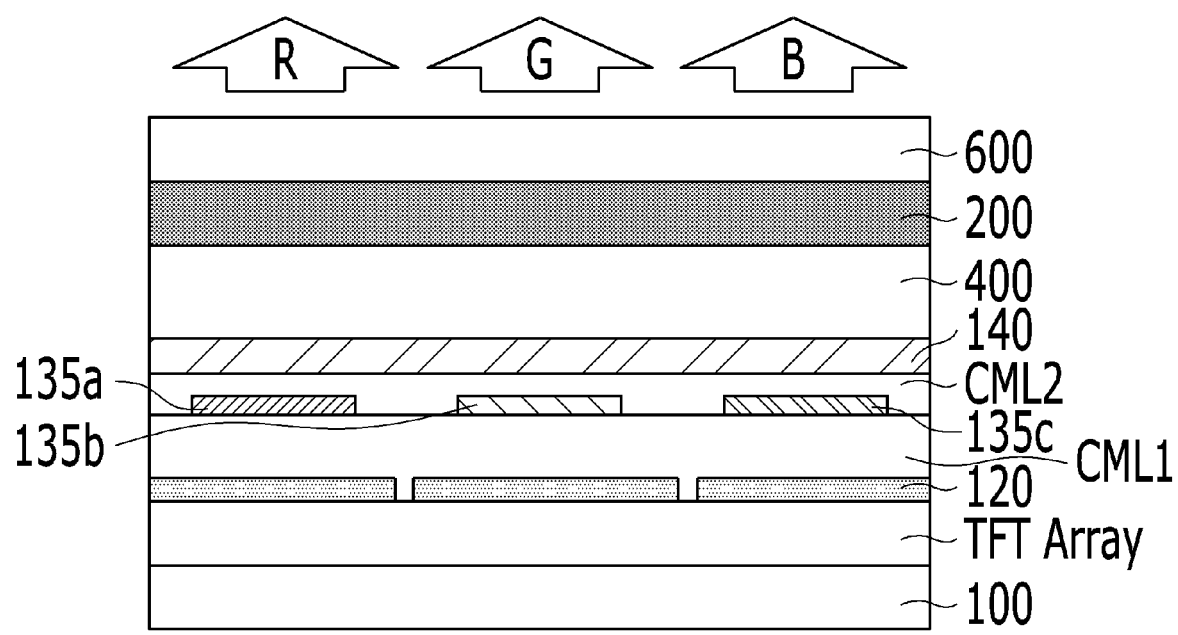
FIG. 7 is a cross-sectional view illustrating region B of FIG. 1.

FIG. 3 is an enlarged top view illustrating region B of FIG. 1 in a display device according to a second embodiment of the present invention. FIG. 4A is an enlarged top view illustrating region A of FIG. 1 in the display device according to the second embodiment of the present invention. FIG. 4B is an enlarged top view illustrating region A of FIG. 1 in a display device according to a third embodiment of the present invention. FIG. 5 is a circuit diagram of each subpixel. FIG. 6 is a cross-sectional view of region A according to an example of the second embodiment. FIG. 7 is a cross-sectional view illustrating region B of FIG. 1.

In FIGS. 2A and 2B, the shape of the above-mentioned emission portion is given merely by way of example. In some cases, the emission portions R_EM, G_EM, and B_EM, which emit light of different colors, can have the same area, as illustrated in FIG. 3.

Each subpixel includes an associated emission portion R_EM, G_EM, or B_EM, and include a scan line(s) Sn, Sn+1, Sn+2, . . . , and a data line(s) Dm, Dm+1, Dm+2, . . . , to drive the emission portion, where n and m are positive numbers such as a positive integer. FIG. 3 illustrates an example in which the scan lines Sn, Sn+1, and Sn+2 and the data lines Dm, Dm+1, and Dm+2 are arranged without overlapping the emission portions R_EM, G_EM, and B_EM. However, when the light-emitting device is a top-emission-type device and the first electrode thereof is used as a reflective electrode, scan lines Sn, Sn+1, and Sn+2 and data lines Dm, Dm+1, and Dm+2 can also be provided while overlapping emission portions R_EM, G_EM, and B_EM, respectively. At least every subpixel SP includes at least one scan line Sn, Sn+1, or Sn+2 and at least one data line Dm, Dm+1, or Dm+2, and at least one thin film transistor is provided at the intersection of the scan line and the data line. The thin film transistor is connected to the light-emitting device that turns on/off the associated emission portion.

As illustrated in FIG. 4A, the display device according to the second embodiment of the present invention is configured such that the resolution in the camera region is a quarter of the resolution of the non-camera region in FIG. 3. The subpixels are repeated at the same pitch and are arranged at the same distance of wiring in FIG. 3. However, in the camera region of FIG. 4A, a transmission portion T pertains to a region where the emission portions are not disposed. In this case, one fourth of the camera region is an emission portion area and three fourths thereof is a transmission portion area. Accordingly, due to the increase in area of the transmission portion, it is possible to improve camera recognition performance when the camera 700 detects ambient light, and to prevent the camera from being visible from the outside when the camera is turned off.

As in the example illustrated in FIG. 4A, in the camera region of the display device according to the second embodiment of the present invention, each of scan lines Sk and Sk+1 and data lines Dj and Dj+1 is halved in wiring in both of horizontal and vertical directions, compared to the non-camera region, so that the wiring distance in the camera region is larger than that in the non-camera region. Here, k and j can be positive numbers such as positive integers. In such a structure, in some cases, in order to further improve the transmittance of the transmission portion, the scan lines and data lines overlapping the transmission portion can be bypassed around the transmission portion.

As illustrated in FIG. 4B, the display device according to the third embodiment of the present invention is configured such that the resolution of the camera region is a quarter of the resolution of the non-camera region in FIG. 3, and such that the area of each emission portion in the camera region is four times that in the non-camera region. Even in this case, in the camera region, each of horizontal scan lines and vertical data lines is halved in the same area, compared to the non-camera region. Here, since the wiring distance between the scan lines and between the data lines in the camera region is twice that in the non-camera region, it is possible to reduce the density of arrangement of the emission portions R_EM, B_EM, and G_EM by ¼ times (½*½=¼).

For example, the display device according to one or more embodiments of the present invention includes the subpixel in the camera region to realize display in that region, in which case in order to prevent the camera from being recognized by ambient light when the camera is turned off, the density of arrangement in the array unit corresponding to the camera region is relatively lower than that in the array unit of the non-camera region. In this case, the wiring distance in the camera region, which is required for the same area, is increased compared to the non-camera region, and the transmission portion is increased to increase ambient light transmission. Thus, the transmittance of the array unit in the camera region is relatively higher than that in the non-camera region.

As illustrated in FIGS. 4A and 4B, the wiring distance between the scan lines Sk, . . . or Sk+1, . . . , and between the data lines Dj, . . . or Dj+1, . . . , which separate the subpixels in the camera region, can be larger than the wiring distance between the lines that separate the subpixels of the second array unit in the non-camera region.

As illustrated in FIG. 4B, the area of each emission portion in the camera region can be larger than that in the non-camera region. In addition, the first distance between the emission portions of the subpixels adjacent to the region B as the non-camera region can be smaller than the second distance between the emission portions of the subpixels adjacent to the region A as the camera region.

As illustrated in FIG. 4B, when the area of each emission portion in the camera region is larger than that in the non-camera region, the area of the first electrode 125 (see FIG. 8) of the light-emitting device can also be increased corresponding to the increased area of the emission portion.

Meanwhile, the above-mentioned difference in resolution between the camera region and the non-camera region is given merely by way of example. In order to increase the transmittance of the camera region, the emission portion can have a difference in resolution from the above example or a different wiring arrangement structure.

As illustrated in FIG. 5, each of the subpixels SP can include a light-emitting device OLED, a driving transistor DT, a switching transistor ST1 connected to a gate electrode of the driving transistor DT, and a storage capacitor Cst. In the subpixel SP, the driving transistor DT is connected to the light-emitting device OLED to adjust the emission of light from the subpixel SP. When the emission layer provided in the light-emitting device OLED contains an organic material as a main component according to the physical properties thereof, the light-emitting device can be referred to as an organic light-emitting device and the light-emitting display device can be referred to as an organic light-emitting display device (e.g., it can be an organic light emitting diode). Alternatively, when the emission layer provided in the light-emitting device contains an inorganic material, the light-emitting device can be referred to as an inorganic light-emitting device and the light-emitting display device including the inorganic light-emitting device can be referred to as an inorganic light-emitting display device. The circuit diagram of FIG. 5 illustrates an example in which the light-emitting device is used as an organic light-emitting device, but it can be equally applied even when the light-emitting device is used as an inorganic light-emitting device.

Specifically, as illustrated in FIG. 5, the subpixel SP is driven by a scan line Sk and a data line Dj, which intersect each other. The switching transistor ST1 is connected both to the scan line Sk and to the data line Dj, and is provided at the intersection thereof. The switching transistor ST1 is turned on by the gate signal of the scan line Sk and supplied with the data voltage of the data line Dj, thereby being switched. In some cases, the switching transistor ST1 can consist of a plurality of switching transistors.

The driving transistor DT is disposed between a second source voltage line VDDL, to which a second source voltage is supplied, and the light-emitting device OLED. The driving transistor DT adjusts the current flowing from the second source voltage line VDDL to the light-emitting device OLED depending on the difference in voltage between the gate electrode and the source electrode of the driving transistor DT. The gate electrode of the driving transistor DT can be connected to the source electrode of the switching transistor ST1, the drain electrode of the driving transistor DT can be connected to the second source voltage line VDDL, and the source electrode of the driving transistor DT can be connected to the first electrode of the light-emitting device OLED. The second source voltage line VDDL can be a high-potential voltage line to which a high-potential source voltage is supplied.

The light-emitting device OLED emits light in response to the supply of current through the driving transistor DT. The first electrode (anode electrode) of the light-emitting device OLED can be connected to the source electrode of the driving transistor DT, and the second electrode (cathode electrode) of the light-emitting device OLED can be connected to a first source voltage line VSSL, to which a first source voltage is supplied. The first source voltage line VSSL can be a low-potential voltage line to which a low-potential source voltage is supplied.

The light-emitting device OLED can include a first electrode, a hole transport layer, an emission layer, an electron transport layer, and a second electrode. In the light-emitting device OLED, when a voltage is applied to the first and second electrode, holes and electrons are moved to the emission layer through the respective hole transport layer and electron transport layer, and recombined in the emission layer to emit light. The emission layer can be an organic emission layer or an inorganic emission layer. In addition to the emission layer, the hole transport layer and/or the electron transport layer functioning to transport carriers can be an organic layer or an inorganic layer. One of the hole transport layer and the electron transport layer can be formed as an organic layer in common in an active region AA.

The capacitor Cst is formed between the gate electrode and the source electrode of the driving transistor DT, and stores a differential voltage between the gate voltage and the source voltage of the driving transistor DT.

One electrode of the capacitor Cst can be connected to the gate electrode of the driving transistor DT and the source electrode of the switching transistor ST1, and the other electrode thereof can be connected to the source electrode of the driving transistor DT and the first electrode of the light-emitting device OLED.

Meanwhile, each of the thin film transistors of the above-mentioned driving transistor DT and switching transistor ST1 can include a semiconductor layer, a source electrode and a drain electrode connected to both sides of the semiconductor layer, and a gate electrode overlapping the semiconductor layer, with a gate insulating layer interposed between the gate electrode and the semiconductor layer. The semiconductor layer can be an oxide semiconductor layer, a polysilicon layer, or an amorphous silicon layer, or can be formed by stacking one or more thereof.

Meanwhile, the pad unit PAD provided at a portion of the outer region NA of FIG. 1 includes pad electrodes) connected to the scan line Sk, the data line Dj, and the first and second source voltage lines VSSL and VDDL, through the extension thereof, provided in the subpixel SP. The pad electrodes are connected to flexible films, respectively, to apply a voltage signal to each of the lines.

As illustrated in FIGS. 6 and 7, a thin film transistor array TFT array, which includes a thin film transistor (a driving transistor DT and a switching transistor ST1) and a capacitor Cst included in each subpixel, is provided on the second surface (upper surface) of the substrate 100.

As illustrated in FIG. 7, the light-emitting device in the non-camera region includes a first electrode 120, a first common layer CML1, emission layers 135a, 135b, and 135c, a second common layer CML2, and a second electrode 140.

The first common layer CML1 is a layer related to hole injection and transport, such as a hole injection layer and a hole transport layer, and the second common layer CML2 is a layer related to electron injection such as an electron transport layer. At least one of the first and second common layers CIVIL1 and CML2 can consist of a plurality of layers, and the light-emitting device OLED can include at least one of the first and second common layers CIVIL1 and CML2. The layer removed from the first and second common layers CIVIL1 and CML2 can function by containing associated components in the emission layers 135a, 135b, and 135c or other layers.

As illustrated in FIGS. 6 and 7, the first and second common layers CML1 and CML2 are formed as common layers in succession in adjacent subpixels SP.

As illustrated in FIG. 6, they are formed continuously in the subpixels in the camera region.

FIG. 6 illustrates that the transmission portion T is provided corresponding to the camera region, as illustrated in FIG. 4A. The emission layers 135a, 135b, and 135c are removed from the transmission portion T, and the first electrode 120 is also removed therefrom.

In the second embodiment of FIG. 6, the second electrode 140a in the camera region can be made of metal having a higher transmittance than the non-camera region or can be thinned, thereby increasing the transmittance of the camera region. This is given merely by way of example. In a modification of the second embodiment, the second electrode can be made of the same translucent metal or transparent metal as the second electrode 140 in the adjacent non-camera region.

The first electrode 120 can be used as a reflective electrode, and the second electrode 140 can be used as a transparent electrode or be made of translucent metal. For example, the reflective electrode used for the first electrode 120 can be made of aluminum, aluminum alloy, silver alloy, magnesium alloy, APC (Au—Pt—Cu), or the like. For example, the transparent electrode used for the second electrode 140 can be made of ITO (Indium Tin Oxide) or IZO (Indium Zinc Oxide), and the translucent metal can be AgMg, silver alloy, magnesium alloy, APC (Au—Pt—Cu), or the like.

A touch sensor 400 can be provided on the light-emitting device formed by stacking the first electrode 120, the first common layer CML1, the emission layers 135a, 135b, and 135c, the second common layer CML2, and the second electrode 140/140a. The touch sensor 400 can include an encapsulation layer 1450 (see FIG. 11) and a touch-sensing electrode 1470 (see FIG. 11), which cover the upper portion of the second electrode 140 of the light-emitting device.

A polarizing film 200 and a transparent protective film or transparent protective glass 600 can be provided on the touch sensor 400.

FIG. 6 illustrates that the transparent film 250 is included corresponding to the same layer as the polarizing film 200 so as to correspond to the camera region. In the structure of FIG. 6, as described above, it is possible to increase the ability to recognize ambient light entering the transparent camera 700 by removing the polarizing film 200, the first electrode 120 containing reflective electrode components, and the emission layers 135a, 135b, and 135c to increase the transmittance of the second electrode 140a.

Meanwhile, the camera 700 includes a lens 710 configured to converge ambient light, a body 720 configured to surround and support the lens 710, and a camera substrate 730 configured to analyze the light received into the lens 710 and have a camera circuit located beneath the body 720. At least the lens 710 and body 720 of the camera 700 can be inserted into the stepped section 100a. Thus, in the under display structure in which the camera 700 is provided beneath the substrate 100, it is possible to realize a slim device through vertical integration of module components.

Figure 8:
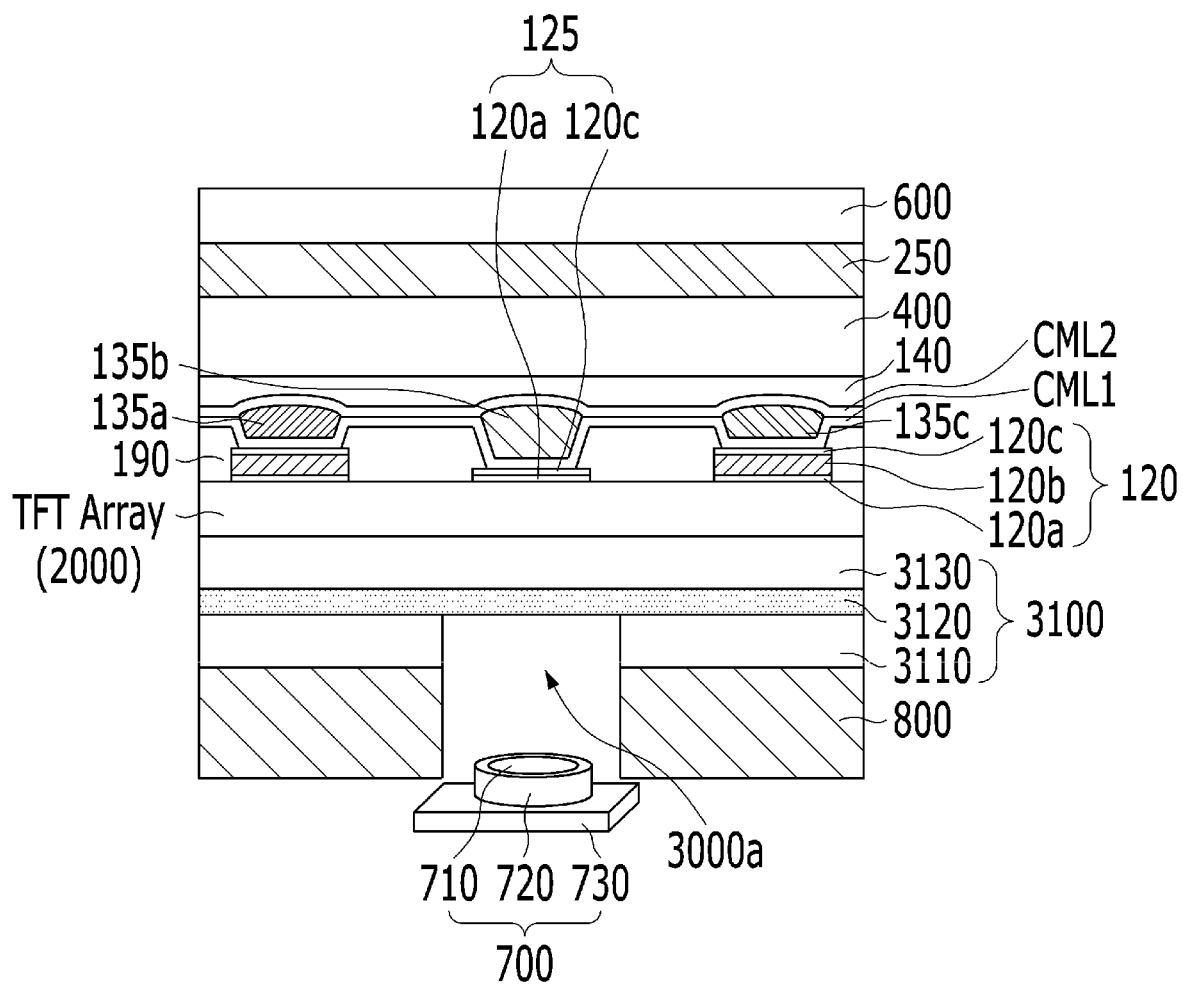
FIG. 8 is a cross-sectional view illustrating region A of FIG. 1 in the display device according to the third embodiment of the present invention.

FIG. 8 is a cross-sectional view illustrating region A of FIG. 1 in the display device according to the third embodiment.

As illustrated in FIG. 8, the display device according to the third embodiment of the present invention includes a substrate 3100 consisting of a plurality of layers, and a stepped section 3000a provided in the substrate 3100 and corresponding to a camera 700. The stepped section 3000a is formed by removing a portion of the substrate 3100 to the lower surface of an interlayer inorganic insulating layer 3120.

The substrate 3100 is formed by stacking a first polymer layer 3110, an interlayer inorganic insulating layer 3120, and a second polymer layer 3130. In this case, the interlayer inorganic insulating layer 3120 is provided between the polymer layers 3110 and 3130 made of an organic material, which is advantageous in that the interlayer inorganic insulating layer 3120 breaks a moisture-permeable path that can be vertically formed in a layer made of organic material.

The stepped section 3000a is defined by removing the thickness of the first polymer layer 3110. Even in the structure in which the substrate 3110 corresponding to the camera 700 and the array components on the substrate have an increased transmittance, since the interlayer inorganic insulating layer 3120, which is relatively resistant to moisture permeation, is directly exposed to the stepped section 3000a, it is possible to maintain a vertical moisture permeation prevention capability.

The first polymer layer 3110 and the second polymer layer 3130 are made of, for example, an organic resin such as polyimide or polyamide. In the third embodiment, the second polymer layer 3130 is preferably made of a transparent organic resin. The first polymer layer 3110 can be made of a transparent organic resin or a colored organic resin.

The interlayer insulating film 3120 can be, for example, a silicon inorganic layer made of SiOx, SiOxNy, SiNx, or the like.

In addition, the component 800 provided on the back surface of the substrate 3100 is a back protective film, which protects the back surface of the substrate 3100 and serves to prevent permanently plastic deformation of the substrate 3100 made of a thin plastic material.

In this case, the camera 700 corresponds to the lower side of the back protective film 800. Accordingly, in order to facilitate the insertion of the camera 700, the back protective film 800 is also removed corresponding to the region of the camera 700.

For example, when the camera 700 has a circular hole shape as illustrated in FIG. 1, the back protective film 800 and the stepped section 3000a can also have circular plane shape or a vertically removed hole shape.

The TFT array 2000 formed on the substrate 3100 can include a thin film transistor, a capacitor, and the like in each subpixel.

In the example illustrated in FIG. 8, the first electrode 125 can include only first and second transparent electrode layers 120a and 120c so as to correspond to the region of the camera 700. In this case, since the first electrode 120 around the camera 700 is formed by stacking the first transparent electrode layer 120a, the reflective electrode layer 120b, and the second transparent electrode layer 120c, only the reflective electrode is removed from the first electrode 125 corresponding to the region of the camera 700, thereby improving the ability that the camera 700 recognizes ambient light.

In the embodiment illustrated in FIG. 8, a light-emitting device including a first electrode 125, an emission layer 135b, and a second electrode 140 is provided in the region corresponding to the camera 700. This embodiment is similar to the embodiment of FIG. 4B. Thus, any layer 3110 of the substrate 3100 is removed to increase transmittance, so that ambient light is visually recognized at the corresponding region of the camera 700 while a selective emission operation is also possible due to the provision of the light-emitting device.

Since the remaining configuration is the same as that of the above-mentioned embodiment(s) and thus has the same function, a description thereof will be omitted or may be brief.

Figure 9:
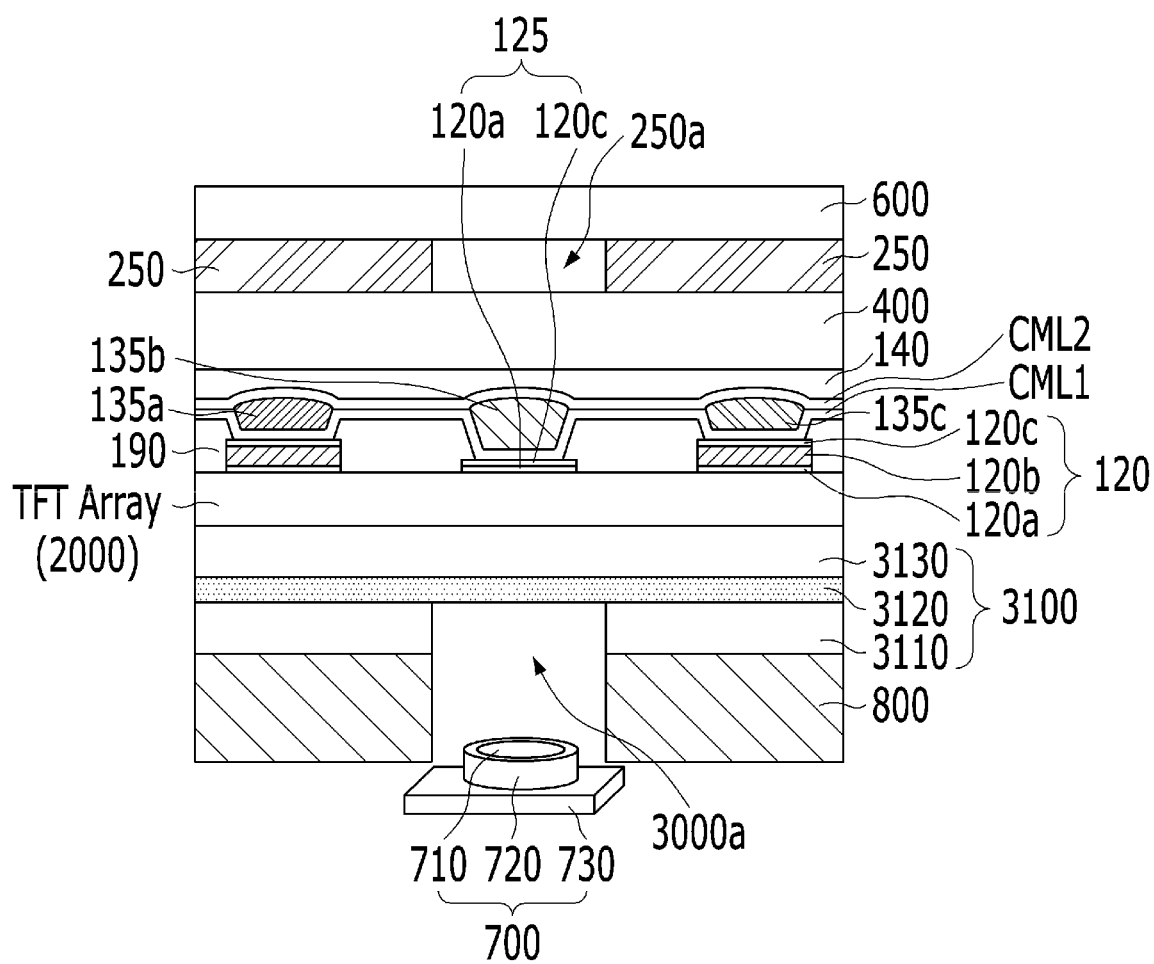
FIG. 9 is a cross-sectional view illustrating region A of FIG. 1 in a display device according to a fourth embodiment of the present invention.

FIG. 9 is a cross-sectional view illustrating region A of FIG. 1 in a display device according to a fourth embodiment of the present invention.

As illustrated in FIG. 9, the display device according to the fourth embodiment differs from that of the third embodiment in that the polarizing plate 250 is provided with a bleaching section 250a only in a region corresponding to the camera 700. The bleaching section 250a is a transparent section formed by processing a dichroic dye, corresponding to the camera 700 in the polarizing plate, with treatment such as UV before or after forming the polarizing plate 250. Thus, the provision of the bleaching section 250a is advantageous in that it is possible to enhance the recognition capability of the camera 700 through the transmittance of ambient light converging to the camera 700.

In some cases, for the same purpose of increasing transmittance, a modification of the embodiment is also possible in which the region corresponding to the camera 700 is emptied by patterning the polarizing plate 250.

Figure 10:
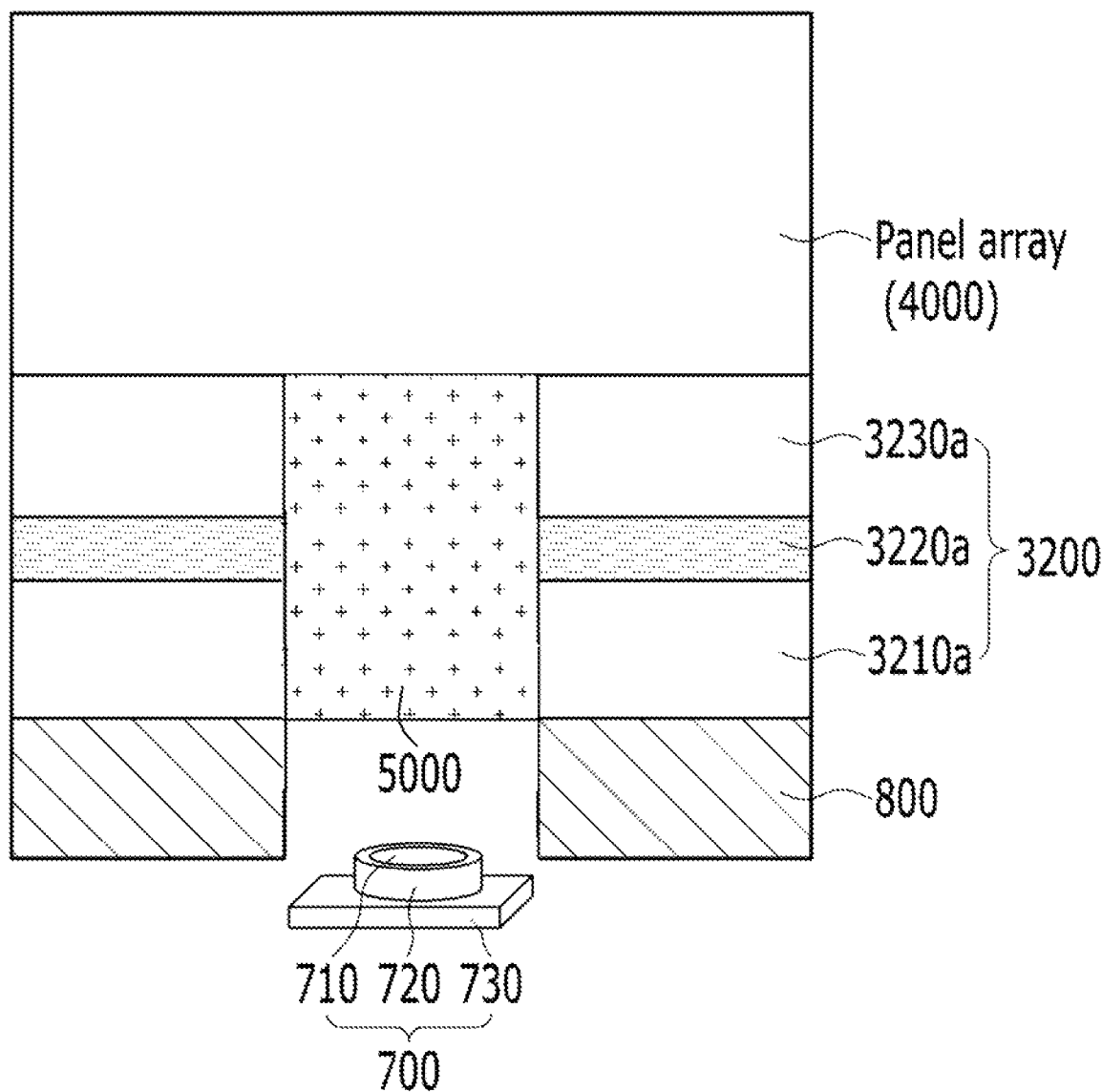
FIG. 10 is a cross-sectional view illustrating region A of FIG. 1 in a display device according to a fifth embodiment of the present invention.

FIG. 10 is a cross-sectional view illustrating region A of FIG. 1 in a display device according to a fifth embodiment.

As illustrated in FIG. 10, the display device according to the fifth embodiment of the present invention includes a substrate 3200 consisting of three layers, namely, a first polymer layer 3210a, an interlayer inorganic insulating layer 3220a, and a second polymer layer 3230a, and a stepped section formed by removing the entire layer of the substrate 3200 corresponding to the camera 700. In this case, as the thickness of the removed region increases, the light component absorbed by the substrate 3200 does not affect the camera 700. Thus, the camera has a high convergence of ambient light to increase transmittance, thereby improving the recognition capability of the camera 700.

In this case, the stepped section corresponding to the camera 700 has a thickness of 10 μm to 200 μm, which can be largely different from other regions. Accordingly, the stepped section can be filled with a transparent reinforcing member 5000 to prevent a change in shape or contamination due to foreign substances.

After filling the transparent reinforcing member 5000, a back protective film 800 having a hole in the portion thereof corresponding to the camera 700 can be provided beneath the substrate 3200 to protect the back surface of the substrate 3200.

The transparent reinforcing member 5000 and the back protective film 800 can be intended to protect the lower surface of the substrate 3200, and can have a function of preventing foreign substances and moisture permeation.

On the upper surface of the substrate 3200, a panel array 4000 including the above-mentioned thin film transistor array 2000, a touch sensor 400, a polarizing film 250, and a transparent protective film or transparent protective glass 600 can be formed.

A plurality of buffer layer can be provided on the lowest surface of the panel array 4000 in contact with the transparent reinforcing member 5000. In this case, the thin film transistor array including the thin film transistors is formed on the buffer layers.

Figure 11:
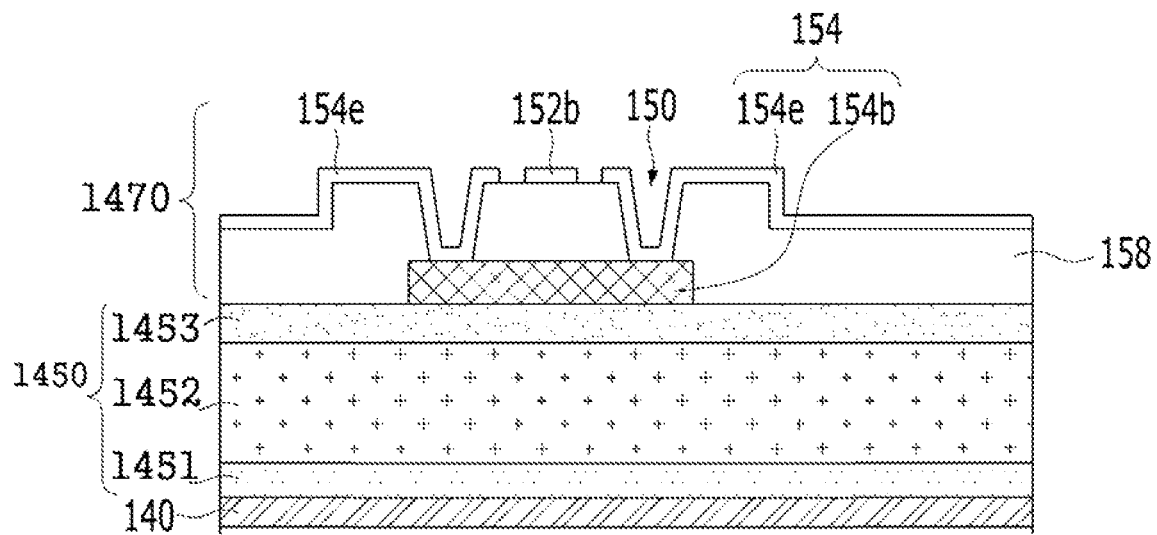
FIG. 11 is a cross-sectional view illustrating an example of a touch sensor in the display device according to one or more embodiments of the present invention.

FIG. 11 is a cross-sectional view illustrating an example of a touch sensor in the display device according to one or more embodiments of the present invention.

In the above-mentioned various cross-sectional views, reference numeral 400 schematically illustrated on the second electrode 140 is a touch sensor as illustrated in FIG. 10. The touch sensor includes an encapsulation unit 1450 in which inorganic encapsulation layers 1451 and 1453 and organic encapsulation layers 1452 are alternately interposed, and a touch electrode unit 1470 including first and second touch electrodes 154 and 152*b* intersecting each other.

The inorganic encapsulation layers 1451 and 1453 and the organic encapsulation layers 1452 are composed of at least one pair. The inorganic encapsulation layers 1451 and 1453 have a function of preventing moisture permeation, and the organic encapsulation layers 1452 have a function of preventing particle permeation and a flow. In the configuration of FIG. 11, the encapsulation unit 1450 is formed to protect at least both the camera region and the non-camera region, and can have an area equal to or larger than the illustrated optical film 300.

An example of the touch electrode unit 1470 is illustrated. For example, the first touch electrode 154 includes a plurality of island-shaped first touch electrode patterns 154*e* and a bridge electrode 154*b* connecting the adjacent first touch electrode patterns 154*e* to another layer, and the second touch electrode 152*b* is spaced apart from the first touch electrode patterns 154*e* on the same layer to pass in a direction crossing the first touch electrode patterns 154*e*.

A touch insulating layer 158 can be provided between the bridge electrode 154*b*, the first electrode patterns 154*e*, and the second touch electrode 152*b*.

An example of the touch electrode unit 1470 is illustrated. Each of the first and second touch electrodes 154 and 152*b* can include a metal mesh pattern.

Hereinafter, a method of manufacturing the display device according to the present invention will be described.

Figure 12A:
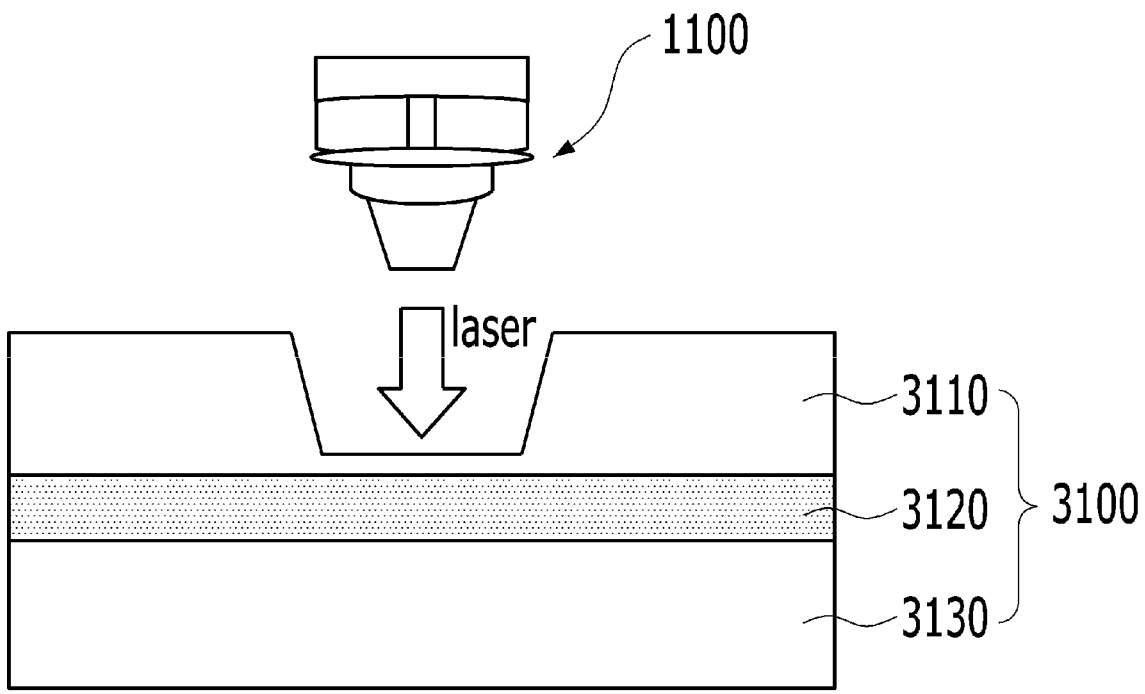
FIGS. 12A to 12C are cross-sectional views illustrating a process of manufacturing the display device according to the first to fourth embodiments of the present invention.
Figure 12B:
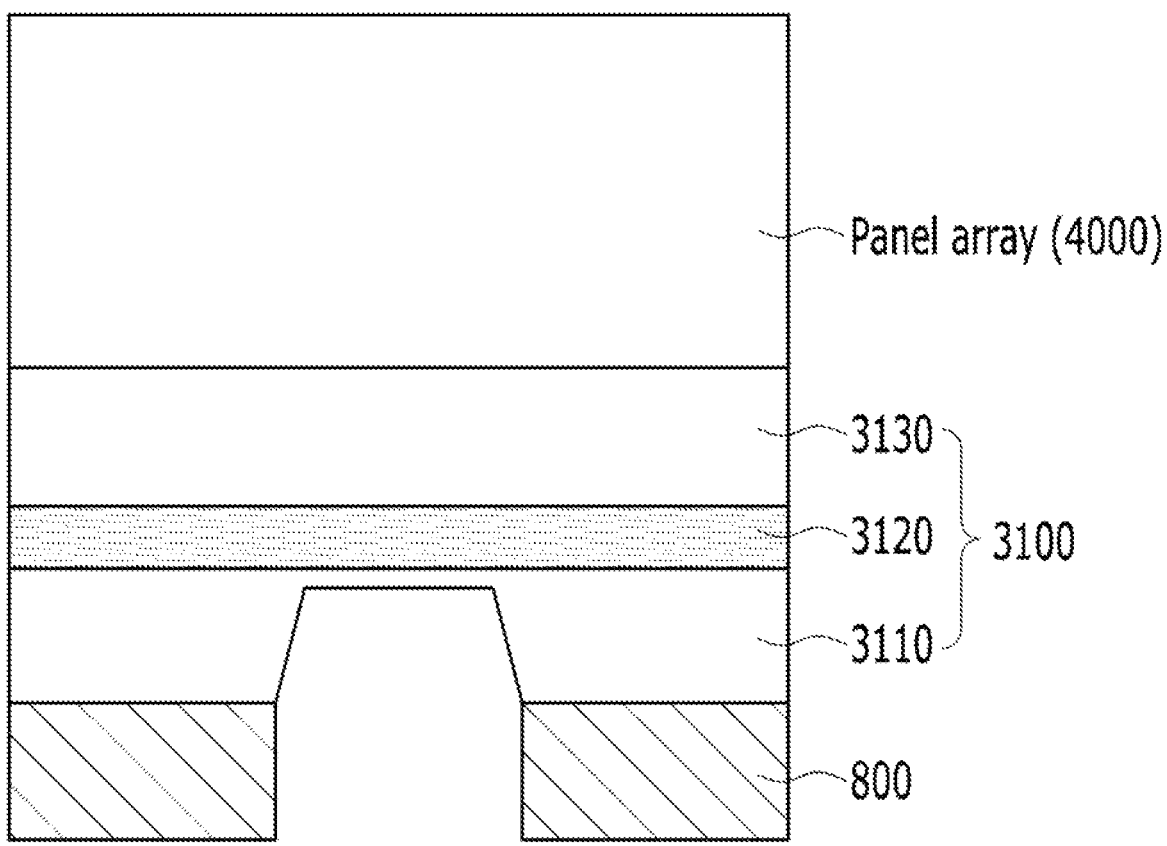
Figure 12C:
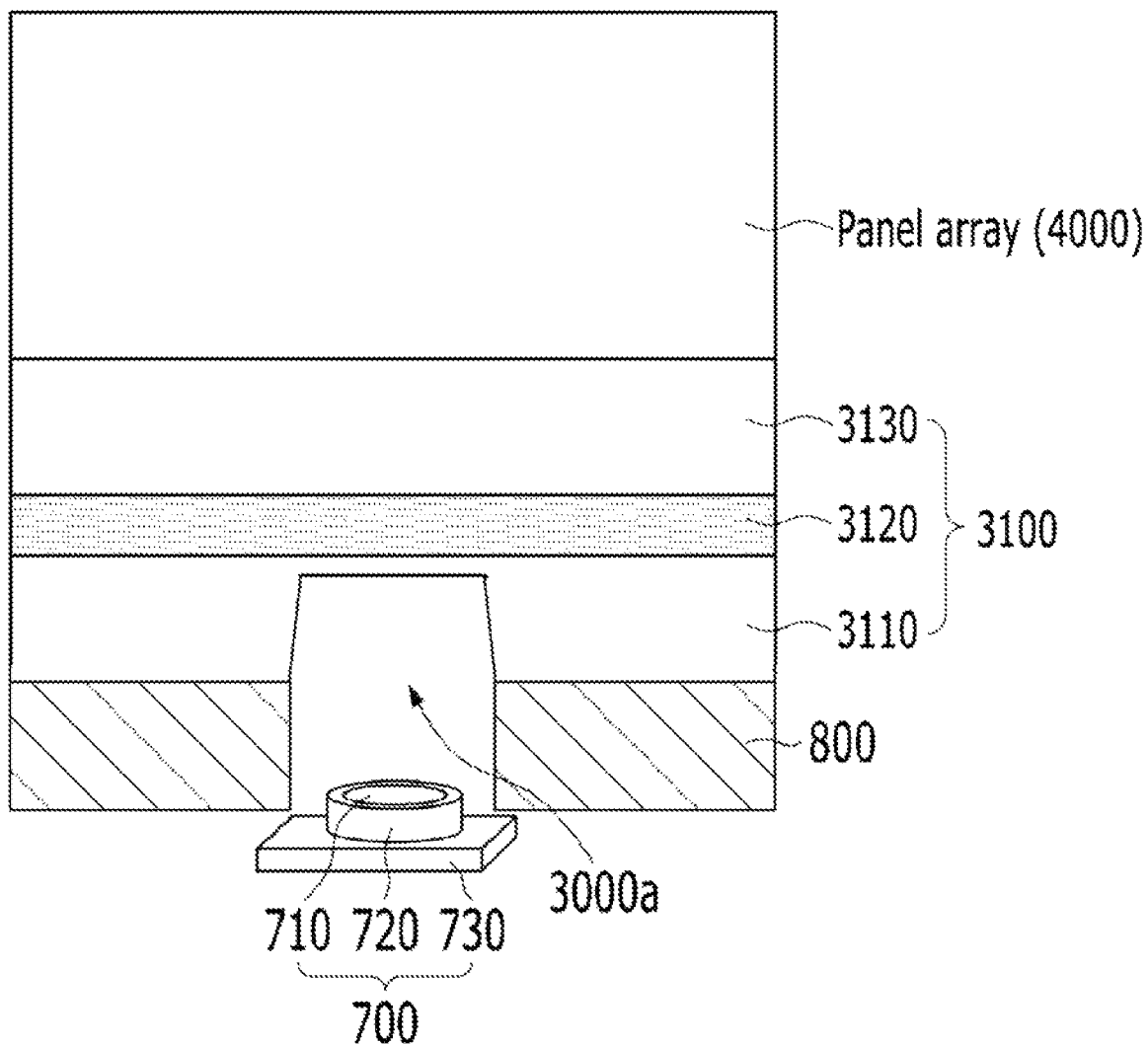

FIGS. 12A to 12C are cross-sectional views illustrating a process of manufacturing the display device according to the first to fourth embodiments of the present invention.

The method of manufacturing the display device according to the first to fourth embodiments of the present invention is implemented as follows. First, a substrate 3100 is prepared which consists of a first polymer layer 3110, an inorganic interlayer insulating layer 3120, and a second polymer layer 3120 stacked in sequence. Subsequently, as illustrated in FIG. 12A, the substrate 3100 is inverted so that the first polymer layer 3110 is located above, and a stepped section is then formed by radiating laser light to the exposed surface of the first polymer layer 3110 using a laser 1100 to remove a certain thickness of the first polymer layer 3110.

Next, as illustrated in FIG. 12B, the substrate 3100 is inverted so that the first polymer layer 3110 with the certain thickness removed is located below, and a panel array 4000 including a thin film transistor array and a light-emitting device is formed on the second polymer layer 3120.

A back protective film 800 is attached to the lower surface of the first polymer layer 3110 to protect the periphery of the stepped section.

Next, as illustrated in FIG. 12C, a camera 700 is inserted into a region exposed by the stepped section formed in the back protective film 800 and the first polymer layer 3110.

The method illustrated in FIGS. 12A to 12C is advantageous in that only the first polymer layer 3110 is removed without completely removing the substrate 3100, so that free inversion is easily performed after the stepped section is formed in the substrate 3100. In addition, after the stepped section is formed in the substrate 3100, the panel array 400 can be easily formed.

FIGS. 13A to 13E are cross-sectional views illustrating a process of manufacturing the display device according to the fifth embodiment of the present invention.

Figure 13A:
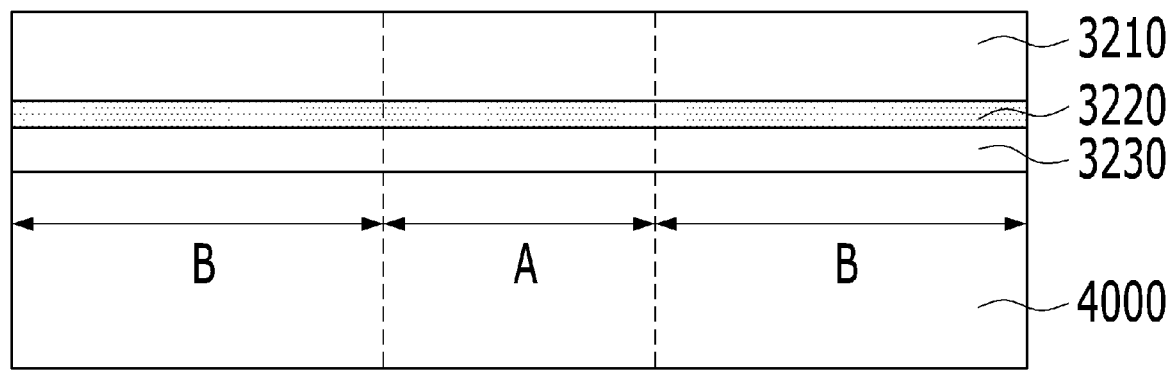
FIGS. 13A to 13E are cross-sectional views illustrating a process of manufacturing the display device according to the fifth embodiment of the present invention.

As illustrated in FIG. 13A, a panel array 4000 is formed above a first polymer layer 3210, an interlayer inorganic insulating layer 3220, and a second polymer layer 3230 stacked in sequence, and they are then inverted. Accordingly, the first polymer layer 3210 is located on the top surface.

Here, region A corresponds to a camera formation region, and region B corresponds to a non-camera formation region.

Figure 13B:
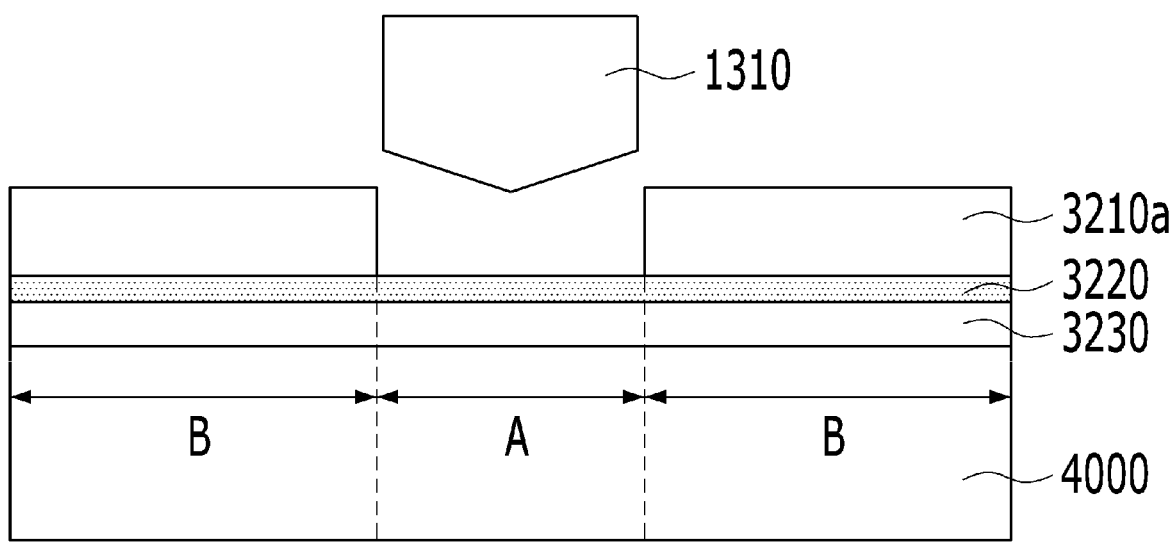

Next, as illustrated in FIG. 13B, a first laser 1310 is applied to the camera forming region A to remove the thickness of the first polymer layer 3210, thereby forming a first polymer layer pattern 3210*a*.

Figure 13C:
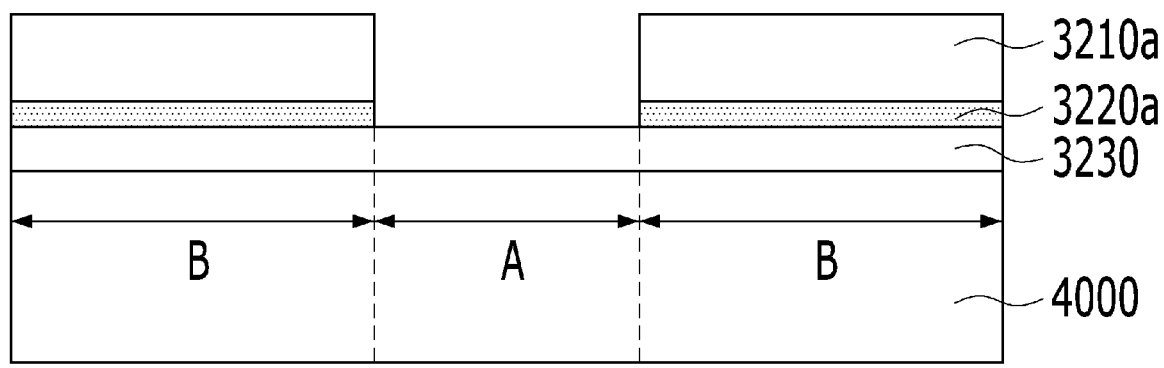

Sequentially, as illustrated in FIG. 13C, etching is performed on the exposed first polymer layer pattern 3210*a* as a mask and on the interlayer inorganic insulating layer 3220 in the camera formation region A, thereby forming an interlayer inorganic insulating layer pattern 3220*a*.

Figure 13D:
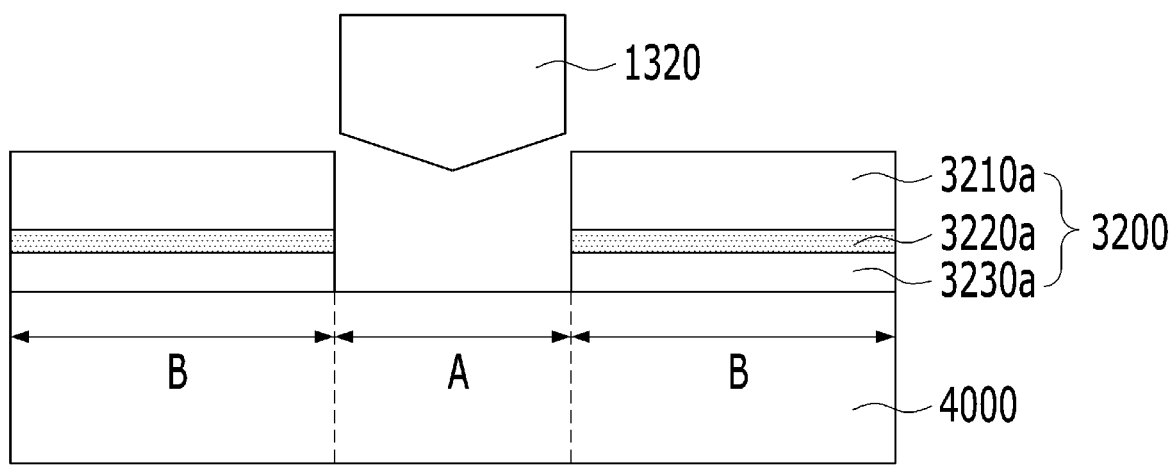

Next, as illustrated in FIG. 13D, a second laser 1320 is applied to remove the exposed second polymer layer 3230, thereby forming a second polymer layer pattern 3230*a*.

Accordingly, the first polymer layer pattern 3210*a*, the interlayer inorganic insulating layer pattern 3220*a*, and the second polymer layer pattern 3230*a*, which are patterned with respect to the camera forming region A, form a substrate 3200.

Figure 13E:
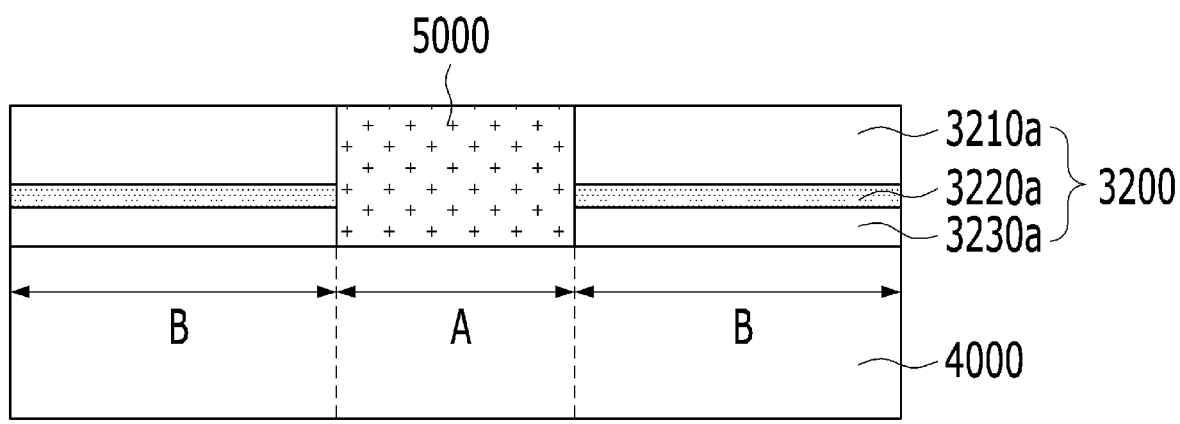

Next, as illustrated in FIG. 13E, the exposed region of the substrate 3200 is filled with a transparent reinforcing member 5000 in order to prevent introduction of foreign substances into the removed region and to secure the support force of the substrate 3200.

The transparent reinforcing member 5000 can be, for example, a transparent film such as PET, and can have a light transmittance higher than or equal to that of the substrate 3200 and a higher rigidity than the substrate 3200.

The stepped section provided in the substrate 3200 can be formed by removing the first polymer layer 3110 so as to correspond to the camera region described in the method illustrated in FIGS. 12A to 12C, or by removing the entire layer of the substrate 3200 so as to correspond to the camera region described in the method illustrated in FIGS. 13A to 13E. Alternatively, the stepped section provided in the substrate 3200 can be formed by removing the first polymer layer 3210 and the interlayer inorganic insulating layer 3220 so as to correspond to the camera region by proceeding to the process illustrated in FIG. 13C.

The display device according to one or more embodiments of the present invention has the following effects and advantages.

Since the camera is provided beneath the array in the active region, there is no need to separately provide a camera bezel outside the active region. Therefore, it is possible to solve or effectively address the problems and limitations associated with the ineffective planar region being increased.

In addition, it is possible to reduce a light loss when the camera observes ambient light and to increase transmittance even when light is emitted, by removing at least a portion of the thickness of the substrate in the region corresponding to the camera.

In addition, it is possible to reduce a light loss when the camera observes ambient light and to increase transmittance even when light is emitted, by removing the polarizing plate in the region corresponding to the camera. In addition, it is possible to reduce a visual difference between the camera region and the non-camera region, as the loss of transmittance is reduced in the camera region.

In addition, by configuring the array in the camera region with the resolution lower than that in the non-camera region, it is possible to reduce a light loss in the camera region and to reduce a visual difference between the camera region and the non-camera region. Here, the difference in resolution between the camera region and the non-camera region can be obtained by adjusting the pitch between the wirings and the size of the emission portion.

The array in the camera region can have an increased light transmittance by forming the transmission region larger than the emission portion.

To this end, a display device according to an embodiment of the present invention can include a substrate divided into a camera region and a non-camera region while having a first surface and a second surface, a camera positioned beneath the first surface of the substrate so as to correspond to the camera region, a stepped section formed by removing a portion of a first thickness from the first surface of the substrate so as to correspond to the camera region, a first array unit including at least one subpixel on the second surface corresponding to the camera region of the substrate, a second array unit including a plurality of subpixels on the second surface corresponding to the non-camera region of the substrate, and an optical film configured to cover the first and second array units.

The second array unit can be configured to include the subpixels arranged therein and to have a first resolution, and the first array unit can be configured to include the subpixels arranged therein and to have a second resolution lower than the first resolution.

A distance between wirings separating the subpixels in the first array unit can be larger than a distance between wirings separating the subpixels in the second array unit.

Each of the subpixels can include a thin film transistor and a light-emitting device connected to the thin film transistor. The light-emitting device can include a first electrode, an emission layer, and a second electrode. The subpixel can include a bank configured to expose an emission portion thereof while overlapping an edge of the first electrode.

The emission portion in the first array unit can have a larger area than the emission portion in the second array unit.

A first distance between the emission portions of the adjacent subpixels in the second array unit can be smaller than a second distance between the emission portions of the adjacent subpixels in the first array unit.

The first electrode of the subpixel in the first array unit can have a larger area than in the second array unit.

The subpixel in the first array unit can further include a transmission portion that does not overlap the emission layer and the bank.

The display device can further include at least one of a first common layer between the first electrode and the emission layer and a second common layer between the second electrode and the emission layer. The first and second common layers can be located in succession in the subpixels of the first and second array units.

The optical film can include a polarizing plate, and the polarizing plate can be provided only at an upper portion of the second array unit.

The display device can further include a transparent film in the same layer as the polarizing plate so as to correspond to an upper portion of the first array unit.

The substrate can include a first polymer layer, an interlayer inorganic insulating layer, and a second polymer layer from the first surface to the second surface.

The first polymer layer can be a colored film or a transparent film, and the second polymer layer can be a transparent film.

The first thickness can be smaller than a total thickness of the substrate.

The first thickness can be a thickness of the first polymer layer.

The first thickness can include a total thickness of the first polymer layer, the interlayer inorganic insulating layer, and the second polymer layer.

The camera can be inserted into the stepped section.

A back protective film can be further provided around the stepped section on the first surface of the substrate.

The stepped section can be filled with a transparent reinforcing material.

A display device according to another embodiment of the present invention can include a substrate divided into a camera region and a non-camera region while having a first surface and a second surface, a camera positioned beneath the first surface of the substrate so as to correspond to the camera region, a stepped section formed by removing a portion of a first thickness from the first surface of the substrate so as to correspond to the camera region, a first array unit including at least one subpixel on the second surface corresponding to the camera region of the substrate, a second array unit including a plurality of subpixels on the second surface corresponding to the non-camera region of the substrate, a touch sensor on the first and second array units, and an optical film configured to cover the touch sensor.

The touch sensor can include an encapsulation layer covering the first and second array units, and a plurality of touch-sensing electrodes on the encapsulation layer.

The stepped section can have a hole shape, and the optical film can include a polarizing plate having a bleaching section shaped corresponding to the stepped section.

The display device can further include a transparent protective film on the polarizing plate.

As is apparent from the above description, the display device according to one or more embodiments of the present invention has the following effects.

First, since the camera is provided beneath the array in the active region, there is no need to separately provide a camera bezel outside the active region. Therefore, it is possible to solve or address the problem with the ineffective planar region being increased.

Second, it is possible to reduce a light loss when the camera observes ambient light and to increase transmittance even when light is emitted, by removing at least a portion of the thickness of the substrate in the region corresponding to the camera.

Third, it is possible to reduce a light loss when the camera observes ambient light and to increase transmittance even when light is emitted, by removing the polarizing plate in the region corresponding to the camera. In addition, it is possible to reduce a visual difference between the camera region and the non-camera region, as the loss of transmittance is reduced in the camera region.

Fourth, by configuring the array in the camera region with the resolution lower than that in the non-camera region, it is possible to reduce a light loss in the camera region and to reduce a visual difference between the camera region and the non-camera region. Here, the difference in resolution between the camera region and the non-camera region can be obtained by adjusting the pitch between the wirings and the size of the emission portion.

Fifth, the array in the camera region can have an increased light transmittance by forming the transmission region larger than the emission portion.

It will be apparent to those skilled in the art that various modifications and variations can be made in the present invention without departing from the spirit or scope of the invention. Thus, it is intended that the present invention covers such modifications and variations to this invention provided they fall within the scope of the appended claims and their equivalents.

What is claimed is:

1. A display device comprising:
a substrate including a first region and a second region adjacent to the first region;
a plurality of first subpixels on the first region of the substrate;
a plurality of second subpixels on the second region of the substrate; and
a stepped section in the substrate corresponding to the first region,
wherein the first region includes a transmission portion adjacent to the plurality of first subpixels,
wherein each of the first and second subpixels includes a first electrode, a first common layer, an organic emission layer, a second common layer, and a second electrode stacked in order,
wherein the first and second common layers extend continuously between adjacent first subpixels of the plurality of first subpixels, and
wherein the stepped section overlaps the transmission portion and the plurality of first subpixels adjacent thereto.

2. The display device according to claim 1, wherein a thickness of the substrate on the first region is thinner than a thickness of the substrate on the second region.

3. The display device according to claim 2, wherein the stepped section is filled with a transparent reinforcing material.

4. The display device according to claim 1, further comprising a camera beneath the substrate in the stepped section corresponding to the first region.

5. The display device according to claim 4, wherein a polarizing plate does not overlap the camera.

6. The display device according to claim 1, wherein the plurality of second subpixels are arranged with a first resolution, and the plurality of first subpixels are arranged with a second resolution lower than the first resolution.

7. The display device according to claim 1, wherein a distance between wirings separating the adjacent first subpixels is larger than a distance between wirings separating the adjacent second subpixels.

8. The display device according to claim 1, wherein each of the first and second subpixels includes a bank configured to expose an emission portion with overlapping an edge of the first electrode, and
wherein the emission portion in each of the first subpixels has a larger area than the emission portion in each of the second subpixels.

9. The display device according to claim 8, wherein each of the first common layer and the second common layer continuously extends to the bank between adjacent emission portions of the plurality of first subpixels, and the plurality of second subpixels and the transmission portion of the first region.

10. The display device according to claim 1, wherein each of the first and second subpixels includes a bank configured to expose an emission portion with overlapping an edge of the first electrode, and
wherein a first distance between the emission portions of adjacent second subpixels is smaller than a second distance between the emission portions of adjacent first subpixels.

11. The display device according to claim 1, wherein each of the first and second subpixels includes a bank configured to expose an emission portion with overlapping an edge of the first electrode, and
wherein the transmission portion does not overlap the bank.

12. The display device according to claim 1, wherein the first electrode of each of the first subpixels has a larger area than the first electrode of each of the second subpixels.

13. The display device according to claim 1, further comprising:
a polarizing plate configured to cover the second subpixels; and
a transparent film configured to cover the first subpixels and disposed on the same layer as the polarizing plate.

14. The display device according to claim 1, wherein the first electrode of each of the first subpixels is transparent, and the first electrode of each of the second subpixels is reflective.

15. The display device according to claim 1, wherein a transmittance of the second electrode on the first region is higher than a transmittance of the second electrode on the second region.

16. A display device comprising:
a substrate including a first region and a second region adjacent to the first region;
a plurality of first subpixels on the first region of the substrate, and arranged to have a first resolution;
a plurality of second subpixels on the second region of the substrate, and arranged to have a second resolution different from the first resolution;
an encapsulation layer on the first and second subpixels;
a plurality of touch electrodes on the encapsulation layer; and
a stepped section in the substrate corresponding to the first region, wherein the first region includes a transmission portion surrounding the plurality of first subpixels so that the transmission portion and the plurality of first subpixels overlap the stepped section, and wherein the substrate comprises a first polymer layer, an interlayer inorganic insulating layer, and a second polymer layer stacked in order.

17. The display device according to claim 16, wherein a thickness of the substrate on the first region is thinner than a thickness of the substrate on the second region.

18. The display device according to claim 17, further comprising a camera beneath the substrate corresponding to the first region, wherein the camera is inserted into the stepped section.

19. The display device according to claim 18, wherein a polarizing plate does not overlap the camera.

20. The display device according to claim 16, wherein the first polymer layer is a colored film or a transparent film, and the second polymer layer is a transparent film.

21. The display device according to claim 16, further comprising a polarizing plate on the plurality of touch electrodes, wherein the polarizing plate has a bleaching section corresponding to the first region.

* * * * *